(12) United States Patent
Edmonds

(10) Patent No.: US 6,642,880 B1
(45) Date of Patent: Nov. 4, 2003

(54) TUNABLE ANALOG TO DIGITAL CONVERTER

(75) Inventor: Johnathan T. Edmonds, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,645

(22) Filed: Jul. 31, 2002

(51) Int. Cl.$^7$ ................................................ H03M 1/12
(52) U.S. Cl. ........................................ 341/155; 341/156
(58) Field of Search ................................ 341/155, 156, 341/118, 120, 119; 340/347 AD

(56) References Cited

U.S. PATENT DOCUMENTS

| | | | | |
|---|---|---|---|---|
| 4,733,217 A | * | 3/1988 | Dingwall | 341/122 |
| 4,849,759 A | * | 7/1989 | Hughes | 341/156 |
| 5,231,398 A | * | 7/1993 | Topper | 341/156 |
| 5,250,948 A | * | 10/1993 | Berstein et al. | 341/131 |
| 6,323,799 B1 | * | 11/2001 | Pasotti et al. | 341/156 |

* cited by examiner

Primary Examiner—Brian Young
Assistant Examiner—John B Nguyen
(74) Attorney, Agent, or Firm—Brinks Hofer Gilson & Lione

(57) ABSTRACT

A tunable analog-to-digital converter which generates samples having M-bits for use with an operating circuit. The operating circuit generates a first enable signal to instruct the analog-to-digital converter to turn on. Additionally, a sensor generates an analog signal in response to a condition. The tunable analog-to-digital converter includes a primary analog-to-digital converter which receives the analog signal and converts the analog signal to a primary digital signal upon receipt of the first enable signal. The tunable analog-to-digital converter also includes a comparator and a secondary analog-to-digital converter. The comparator compares the value of the primary digital signal to a predetermined value and generates a second enable signal depending on the value of the primary digital signal and the predetermined value. The secondary analog-to-digital converter receives the analog signal and converts the analog signal to a secondary digital signal upon receipt of the second enable signal.

17 Claims, 1 Drawing Sheet

TUNABLE ANALOG TO DIGITAL CONVERTER

BACKGROUND

Semiconductor devices are currently in widespread use in a variety of electronic components. Semiconductor devices may retain information, as in a non-volatile memory device, or perform a calculation, such as in a microprocessor or in a digital signal processor. Semiconductor devices consume a certain amount of power to perform their tasks. However, as semiconductor devices consume power, they also dissipate heat. Often times the amount of power consumed generates a considerable amount of heat. If the heat generated by the semiconductor device exceeds a certain range, the semiconductor device may fail. In order to prevent the semiconductor device from failing as a result of generating too much heat, a temperature sensing circuit and a temperature sensor are often deployed to monitor the temperature of the semiconductor device. The temperature sensor monitors the heat generated by the semiconductor device and generates an analog signal as a result. The analog signal is typically a voltage or a current.

Often times, the temperature sensing circuit and the temperature sensor are connected with an analog-to-digital converter which converts the analog signal to a digital value. The digital signal can be input or read by the semiconductor device or by another device. The analog-to-digital converter performs this conversion using a technique called sampling. That is, as the analog signal passes through the analog-to-digital converter, samples are taken at a given interval. For example, if the sampling rate of the analog-to-digital converter is 10 Hz, then ten samples of the analog signal will be taken each second. The accuracy of the sample taken depends upon the accuracy of the analog-to-digital converter. For example, an analog-to-digital converter which has a defined word length of ten bits, can store ten bits of information for every sample. Additionally, an analog-to-digital converter which has a defined word length of eight bits, can store eight bits of information for every sample, which is less than ten bits of information. While larger word lengths are more accurate, they require more power than smaller word lengths.

In certain electronic devices which use an analog-to-digital converter and have limited power, such as laptop computers and personal digital assistance, there is a need for a device or method which could reduce the amount of power consumed by the analog-to-digital converter. Additionally, in certain situations, such as when the heat generated by the electronic device exceeds a certain range, there is also a need for a device or method which could reduce the amount of power being consumed by the electronic device, in order to prevent failure of the electronic device.

SUMMARY

The present invention is defined by the following claims, and nothing in this section should be taken as a limitation on those claims. By way of introduction, the preferred embodiments described below relate to a tunable analog-to-digital converter which generates samples having M-bits for use with an operating circuit. The operating circuit generates a first enable signal to instruct the analog-to-digital converter to turn on. Additionally, a sensor generates an analog signal in response to a condition. The tunable analog-to-digital converter includes a primary analog-to-digital converter which receives the analog signal and converts the analog signal to a primary digital signal upon receipt of the first enable signal. The tunable analog-to-digital converter also includes a comparator and a secondary analog-to-digital converter. The comparator compares the value of the primary digital signal to a predetermined value and generates a second enable signal depending on the value of the primary digital signal and the predetermined value. The secondary analog-to-digital converter receives the analog signal and converts the analog signal to a secondary digital signal upon receipt of the second enable signal. The secondary digital signal comprises less than M-bits.

The preferred embodiments further relate to a method for operating a tunable analog-to-digital converter which generates samples having M-bits for use in an operating circuit. The operating circuit generates a first enable signal to instruct the analog-to-digital converter to turn on. Additionally, a sensor generates an analog signal in response to a condition. The method includes converting the analog signal to a primary digital signal upon receipt of the first enable signal. The method further includes generating a second enable signal depending on the value of the primary digital signal and a predetermined value, and converting the analog signal to a secondary digital signal upon receipt of the second enable signal. The secondary digital signal comprises less than M-bits. Further aspects and advantages of the invention are discussed below in conjunction with the preferred embodiments.

DETAILED DESCRIPTION OF THE PRESENTLY PREFERRED EMBODIMENTS

Figure 1:
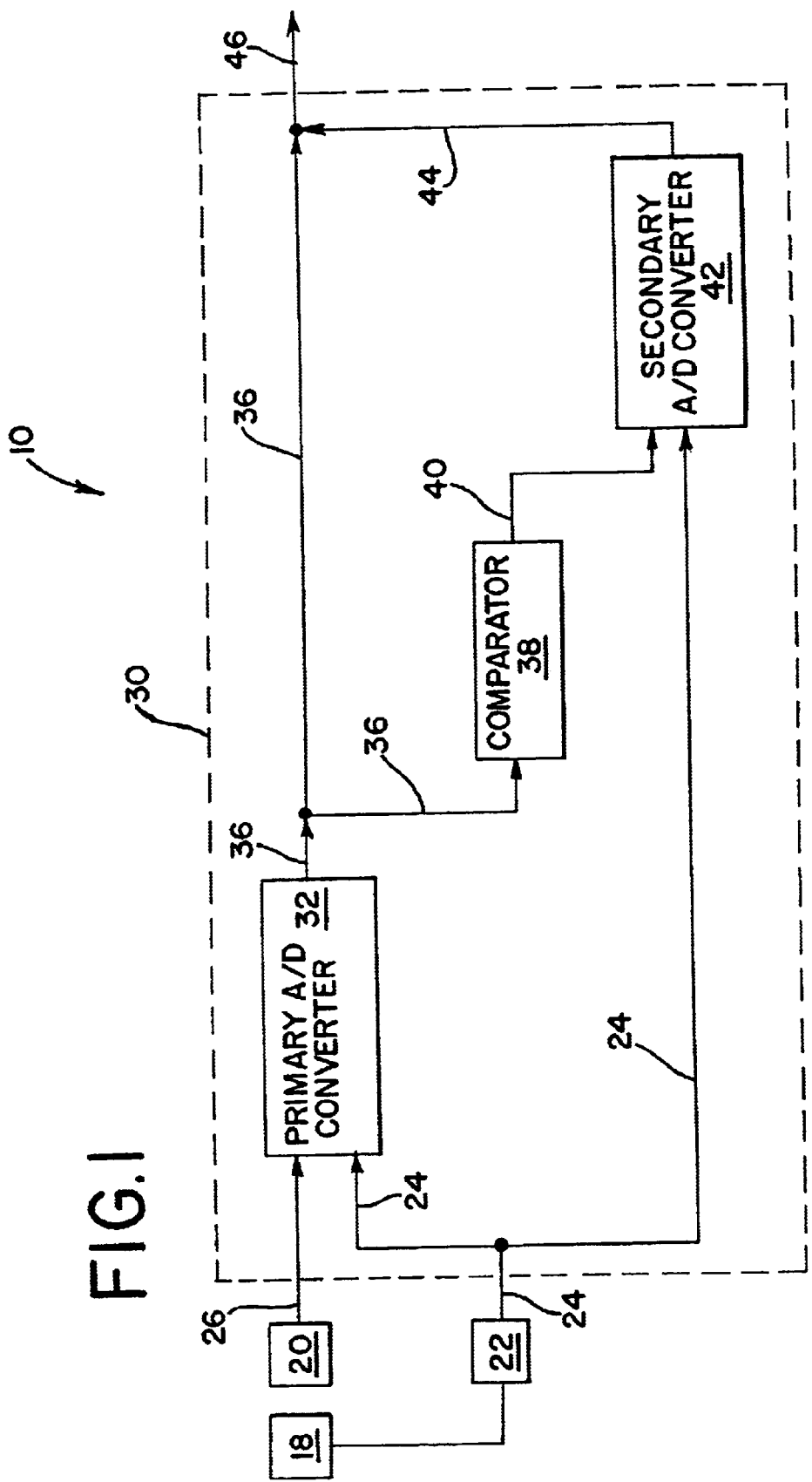
FIG. 1 depicts a block diagram of an exemplary operating circuit and a sensor connected with an analog to digital converter circuit, according to one embodiment.

FIG. 1 shows a block diagram of an exemplary electronic device 10 comprising an operating circuit 20 and a sensor 22 connected with a tunable analog-to-digital converter circuit 30, according to one embodiment. As will be appreciated by one of skill in the art, the present invention may be embodied as a method, data processing system or program. Accordingly, the present invention may take the form of an entirely hardware embodiment, such as in a semiconductor device, as described below, an entirely software embodiment or an embodiment combining software and hardware aspects. Furthermore, the present invention may take the form of a computer program product on a computer-readable storage medium having computer-readable program code embodied in the medium. Any suitable storage medium may be utilized including hard disks, CD-ROMs, DVD-ROMs, optical storage devices, or magnetic storage devices.

The operating circuit 20 takes the form of a semiconductor device, such as, but not limited to: an integrated circuit (e.g., memory cells such as SRAM, DRAM, EPROM, EEPROM, and the like); a programmable logic device; a data communications device; a clock generation device; and so forth. The analog-to-digital converter 30, the sensor 22, and the operating circuit 20 may be incorporated into a multitude of electronic devices 10, including but not limited to computers, automobiles, airplanes, satellites, and the like. In one embodiment, the analog-to-digital converter 30, the sensor 22, and the operating circuit 20 are incorporated or connected with a semiconductor device 18, such as a memory cell, and are used to monitor a condition, such as the temperature of the semiconductor device 18, as illustrated in FIG. 1.

The operating circuit 20 and the sensor 22 both connect with the analog-to-digital converter 30, wherein the operating circuit 20 generates a first enable signal 26 to instruct the analog-to-digital converter 30 to turn on, and wherein the sensor 22 generates an analog signal 24 in response to a condition. The operating circuit 20 may generate the first enable signal 26 at any point to instruct the analog-to-digital converter 30 to turn on. The analog signal 24 may be any type of analog signal, such as a voltage or a current, which can be generated in response to a condition. Additionally, the sensor 22 may be any type of electronic sensor that may be used to monitor any one of a number of conditions, such as temperature, humidity, pressure, light or any other type of condition that may be electronically measured. The sensor 22 may monitor any circuit or device, such as, but not limited to, an operating circuit 20, an appliance, an automobile, a computer, a building, a satellite, and the like. In one embodiment, the sensor 22 monitors the temperature of the operating circuit 20. In another embodiment, the sensor 22 monitors the voltage within the operating circuit 20.

The analog-to-digital converter 30 includes a primary analog-to-digital converter 32, a comparator 38, and a secondary analog-to-digital converter 42. The analog-to-digital converter 30 generates samples having a word length of M bits. Preferably the analog-to-digital converter 30 generates samples having a word length of eight to ten bits, however, the analog-to-digital converter 30 may generates sample having any one of a number of word lengths. Additionally, the analog-to-digital converter 30 can generate samples at any one of a number of frequencies.

The primary analog-to-digital converter 32 receives the analog signal 24 generated by the sensor 22 and converts the analog signal 24 to a primary digital signal 36 upon receipt of the first enable signal 26 from the operating circuit 20. The primary analog-to-digital converter 32 converts the analog signal 24 to the primary digital signal 36 using any one of a number of techniques now known or later developed. The primary analog-to-digital converter 32 converts the analog signal 24 to the primary digital signal 36 by generating a number of samples at a set rate and having a set word length. In one embodiment, the primary analog-to-digital converter 32 generates samples having M bits. In one embodiment, the primary analog-to-digital converter 32 generates samples having less than M bits. By being able to generate less than M bits, the primary analog-to-digital converter 32 is able to reduce the amount of power consumed by the analog-to-digital converter circuit 30, and therefore the amount of power consumed by the electronic device 10.

The comparator 38 is connected with the primary analog-to-digital converter 32 and receives the primary digital signal 36. Upon receipt of the primary digital signal 36, the comparator 38 compares the value of the primary digital signal 36 to a predetermined value and then generates a second enable signal 40 depending on the value of the primary digital signal 36 and the predetermined value. For example, in one embodiment, the comparator 38 generates a second enable signal 40 when the value of the primary digital signal 36 is greater than the predetermined value. Alternatively, in another embodiment, the comparator 38 may generate a second enable signal 40 when the value of the primary digital signal 36 is less than the predetermined value. Additionally, in one embodiment, the comparator 38 may generate a second enable signal 40 when the value of the primary digital signal 36 is within a certain range of predetermined values.

The secondary analog-to-digital converter 42 receives the analog signal 24 and converts the analog signal 24 to a secondary digital signal 44 upon receipt of the second enable signal 40 from the comparator 38. The secondary analog-to-digital converter 42 converts the analog signal 24 to the secondary digital signal 44 using any one of a number of techniques discussed above. The secondary analog-to-digital converter 42 converts the analog signal 24 to the secondary digital signal 44 by generating a number of samples at a set rate and having a set word length. In one embodiment, the secondary analog-to-digital converter 42 generates samples having M bits. In one embodiment, the secondary analog-to-digital converter 42 generates samples having less than M bits. By being able to generate less than M bits, the secondary analog-to-digital converter 32 is able to reduce the amount of power consumed by the analog-to-digital converter circuit 30, and therefore the amount of power consumed by the electronic device 10.

In one embodiment, the primary analog-to-digital converter 32 generates samples having M–N bits and the secondary analog-to-digital converter 42 generates samples having no more than N bits. By dividing the total number of bits, M, generated for each sample by the analog-to-digital converter circuit 30 between both the primary analog-to-digital converter 32 and the secondary analog-to-digital converter 42, the analog-to-digital converter circuit 30 of the present invention is able to operate using less than M bits at certain times in order to reduce the amount of power consumed by the analog-to-digital converter circuit 30, and therefore the amount of power consumed by the electronic device 10. However, the analog-to-digital converter circuit 30 of the present invention is still able to provide up to M bits of accuracy when needed. The total number of bits, M, generated for each sample by the analog-to-digital converter circuit 30 may be divided between both the primary analog-to-digital converter 32 and the secondary analog-to-digital converter 42 in any way the user sees fit. For example, in one embodiment, the primary analog-to-digital converter 32 may generates samples having M–N bits while the secondary analog-to-digital converter 42 may generate samples having N bits. In another embodiment, the primary analog-to-digital converter 32 may generates samples having N bits while the secondary analog-to-digital converter 42 may generate samples having M–N bits. Either way, the combination of both the primary analog-to-digital converter 32 and the secondary analog-to-digital converter 32 results in an analog to digital converter circuit 30 which is capable of generating samples having M bits, M–N bits, or N bits, depending on the operating conditions and the user's requirements.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

What is claimed is:

1. A tunable analog-to-digital converter which generates samples having M bits for use with an operating circuit, and wherein a sensor generates an analog signal in response to a condition, comprising:

a primary analog-to-digital converter which receives the analog signal and converts the analog signal to a primary digital signal, the primary analog-to-digital converter generating samples having M–N bits;

a comparator which compares the value of the primary digital signal to a predetermined value, wherein the comparator generates a second enable signal depending on the value of the primary digital signal and the predetermined value; and a secondary analog-to-digital converter which receives the analog signal and converts the analog signal to a secondary digital signal upon receipt of the second enable signal, the secondary analog-to-digital converter generating no more than N bits.

2. The tunable analog-to-digital converter of claim 1, wherein the primary analog-to-digital converter generates samples having less than M bits.

3. The tunable analog-to-digital converter of claim 1, wherein the analog signal is one of a voltage and a current.

4. The tunable analog-to-digital converter of claim 1, wherein the sensor senses temperature.

5. The tunable analog-to-digital converter of claim 1, wherein the comparator generates a second enable signal when the value of the primary digital signal is greater than the predetermined value.

6. The tunable analog-to-digital converter of claim 1, wherein the comparator generates a second enable signal when the value of the primary digital signal is less than the predetermined value.

7. A method for operating a tunable analog-to-digital converter which generates samples having M bits for use in an operating circuit, and wherein a sensor generates an analog signal in response to a condition, the method comprising:

converting the analog signal to a primary digital signal, the primary digital signal including samples having M–N bits;

generating a second enable signal depending on the value of the primary digital signal and a predetermined value; and converting the analog signal to a secondary digital signal upon receipt of the second enable signal, the secondary digital signal including samples having no more than N bits.

8. The method of claim 7, wherein the primary digital signal includes samples having less than M bits.

9. A method for operating a tunable analog-to-digital converter comprising:

receiving an analog signal; and generating digital signal having a first sample and a second sample, wherein the first sample has a length of M–N bits and the second sample has a length of no more than N bits.

10. The method of claim 9, wherein the analog signal is a voltage.

11. The method of claim 9, further comprising:

converting the analog signal to a primary digital signal; and generating a second enable signal depending on the value of the primary digital signal and a predetermined value.

12. The method of claim 11, further comprising converting the analog signal to a secondary digital signal upon receipt of the second enable signal.

13. A tunable analog-to-digital converter having M bits comprising:

a primary analog-to-digital converter which receives an analog signal and converts the analog signal to a primary digital signal, the primary digital signal including samples having M–N bits;

generating a second enable signal depending on the value of the primary digital signal and a predetermined value; and converting the analog signal to a secondary digital signal upon receipt of the second enable signal, the secondary digital signal including samples having no more than N bits;

a comparator which compares the value of the primary digital signal to a predetermined value, wherein the comparator generates a second enable signal depending on the value of the primary digital signal and the predetermined value; and a secondary analog-to-digital converter which receives the analog signal and converts the analog signal to a secondary digital signal upon receipt of the second enable signal, wherein the secondary digital signal comprises less than M bits.

14. The tunable analog-to-digital converter of claim 13, wherein the analog signal is generated by a sensor that senses temperature.

15. The tunable analog-to-digital converter of claim 13, wherein the primary analog-to-digital converter converts the analog signal to a primary digital signal upon receipt of a first enable signal.

16. The tunable analog-to-digital converter of claim 13, wherein the comparator generates a second enable signal when the value of the primary digital signal is greater than the predetermined value.

17. The tunable analog-to-digital converter of claim 13, wherein the comparator generates a second enable signal when the value of the primary digital signal is less than the predetermined value.

* * * * *